United States Patent [19]

Lee et al.

[11] Patent Number: 5,223,447
[45] Date of Patent: Jun. 29, 1993

[54] DRAM-CELL HAVING AN ISOLATION MERGED TRENCH AND ITS METHOD OF MANUFACTURE

[75] Inventors: Jin H. Lee; Cheon S. Kim; Kyu H. Lee; Dae Y. Kim, all of Daejeon, Rep. of Korea

[73] Assignee: Electronics and Telecommunications Research, Chungnam, Rep. of Korea

[21] Appl. No.: 577,109

[22] Filed: Sep. 4, 1990

[30] Foreign Application Priority Data

Sep. 4, 1989 [KR] Rep. of Korea .................. 89-12747

[51] Int. Cl.⁵ .......................................... H01L 21/265
[52] U.S. Cl. .......................................... 437/47; 437/38
[58] Field of Search .................. 357/23.6 G; 437/47, 437/164, 52, 60

[56] References Cited

U.S. PATENT DOCUMENTS

| | | | |
|---|---|---|---|
| 4,686,552 | 8/1987 | Teng et al. | 357/23.6 G |
| 4,994,409 | 2/1991 | Yoon et al. | 437/228 |
| 5,010,379 | 4/1991 | Ishii | 357/23.6 G |
| 5,041,887 | 8/1991 | Kumagai et al. | 357/23.6 G |
| 5,047,815 | 9/1991 | Yashuira et al. | 357/23.6 G |

FOREIGN PATENT DOCUMENTS

| | | | |
|---|---|---|---|
| 60-261165 | 12/1985 | Japan | 357/23.6 G |
| 62-113467 | 5/1987 | Japan | 357/23.6 G |
| 62-290168 | 12/1987 | Japan | 357/23.6 G |
| 63-45851 | 2/1988 | Japan | 357/23.6 G |
| 63-151070 | 6/1988 | Japan | 357/23.6 G |

OTHER PUBLICATIONS

Kaga, T., et al, "Half Vcc Sheath-Plate ... Buried Plate Wiring", Trans. on Electron Dev. 35(8), 8, 1988, pp. 1257-1263.

*Primary Examiner*—George Fourson

[57] ABSTRACT

A method for manufacturing a DRAM cell is provided having an isolation merged trench for applying to 16 megabit and 64 megabit DRAM cells, which includes the steps forming a primary dielectric for a capacitor within the interior of a trench, depositing an n⁺ doped polysilicon, forming a secondary dielectric and then stacking polysilicon thereon and connecting the polysilicon within an n⁺ diffusion layer of the bottom of the trench for forming a plate. As a result of this method all of the capacitors disposed between the n⁺ polysilicon storing electrode and the n⁺ polysilicon plate as well as the polysilicon storing electrode and the n⁺ diffusion layer plate are utilized as a storing capacitor.

1 Claim, 7 Drawing Sheets

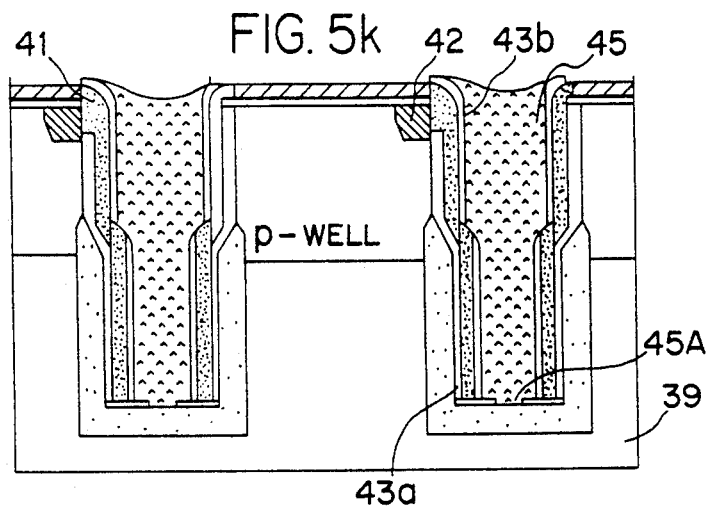
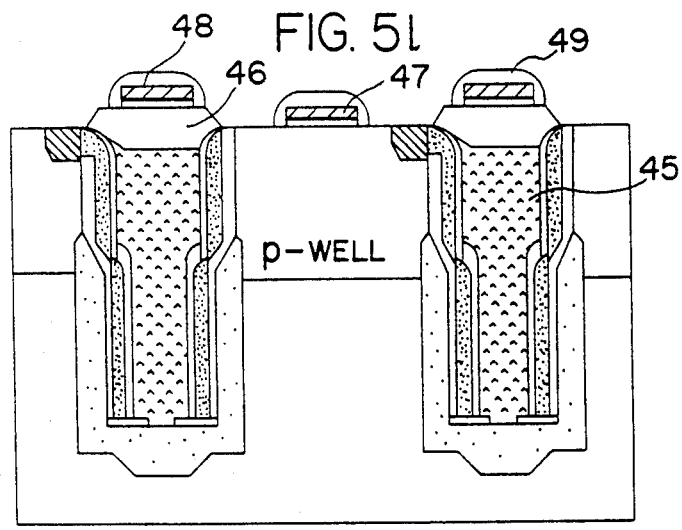
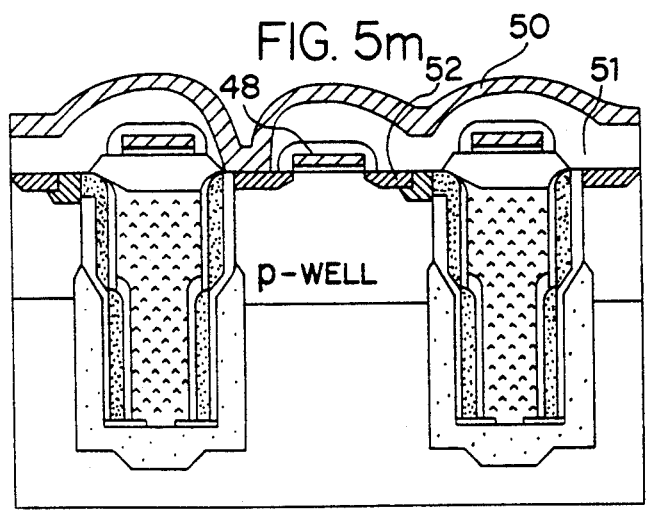

DRAM-CELL HAVING AN ISOLATION MERGED TRENCH AND ITS METHOD OF MANUFACTURE

BACKGROUND OF THE INVENTION

1. Field of the Invention

The present invention relates to a memory cell and its method of manufacture and more particularly, to a dynamic random access memory (hereinafter DRAM) cell having an isolation merged trench for applying to 16 megabit and 64 megabit DRAM cells.

2. Description of the Prior Art

Various types of semiconductor memory devices are well known in the art. In such known semiconductor memory devices, it is a present situation that 1 megabit DRAMs are being mass produced, 4 megabit DRAMs and 16 megabit DRAMs are being developed in pilot productions, and 64 megabit DRAMs are also being developed successively.

In order to develop such large quantity memory devices, fundamental techniques such as lithographic techniques or thin film forming techniques must be developed in addition to developing the DRAM cell as a fundamental element of the DRAM structure.

The DRAM cell has been subjected to many changes from a plane structure to a trench or a stack structure, and the DRAM cell is being developed to maximize the area efficiency as far as possible under a condition that its method of manufacture is allowed.

That is, a high density DRAM cell has been changed from a system for forming a storing capacitor on a plane form so as to reduce the cell area to a system for forming a merged capacitor utilizing a trench as a solid form as well as a stack type capacitor as a system for stacking multiple layers of polysilicon. Presently among such systems, the isolation merged trench structure for surrounding the active region by the trench capacitor has been disclosed as a kind of suitable structure for applying to the DRAM cell to more than 16 megabit or 64 megabit memories.

FIG. 1 and FIG. 2 are sectional views of typical conventional isolation merged trench capacitors showing an isolation merged vertical capacitor cell (hereinafter IVEC) and a surrounded capacitor cell (hereinafter SCC).

The IVEC as shown in FIG. 1 is disclosed by Nippon Telegraph and Telephone Public Corporation of Japan and is related to 4M and 16M DRAM cells. The IVEC is made in such a manner that an isolation region of a switching transistor is utilized as a charge storing capacitor so that the area efficiency of the cell is excellent.

In FIG. 1, reference numeral 1 represents a silicon substrate, numeral 2 is a capacitor dielectric film, numbers 3 and 6 are $n^+$ doped polysilicon regions, numeral 4 is an $n^+$ diffusion layer, numerals 5, 7 and 9 are silicon oxide films, and numeral 8 represents an aluminum metal wiring, respectively. The charge storage of this cell is provided between the first polysilicon 3 of a storing electrode of a trench interior and a second polysilicon 3A of a plate electrode.

In FIG. 2, reference numeral 10 represents a silicon substrate, numeral 11 is a $p^+$ diffusion layer, numerals 12 and 20 are $n^+$ diffusion layers, numeral 13 is a capacitor dielectric film, numerals 14, 17, 18 and 19 are silicon oxide films, numeral 15 is an $n^+$ doped polysilicon region, numeral 16 is an aluminum metal wiring, and numeral 21 represents a polysilicon region, respectively. The isolation region of the switching transistor is utilized as a charge storing capacitor. The charge storage is made by using the $n^+$ diffusion layer 12 doped to the interior wall surface of the trench as a storing electrode and the polysilicon 21 filled within the trench as a plate electrode.

However, such conventional isolation merged trench capacitors have a Hi-C (high capacitance) structure. The Hi-C structure has not only disadvantages of alpha particles, but also disadvantages of a punch-through phenomenon which includes leakage current from the surface between the trenches and the bulk region.

In order to solve such problems, an impurity concentration of the p-substrate or the p-well should be raised for maintaining a value less than a leakage current of pA.

When the impurity concentration of the p-substrate becomes too high, the breakdown voltage is lowered and also various problems such as a body effect of n-MOSFET, a sub-threshold swing, a threshold voltage control becomes apparent. Therefore, in order to overcome such problems, because the required distance between capacitors is determined to be approximately 1.5 $\mu$m as a minimum, it has reached the limit for reducing the unit cell. Because all IVEC and SCC structures utilize a capacitor including one surface as the storing electrode and one surface as the plate electrode, there is a disadvantage that the area efficiency is reduced when used as a highly integrated cell.

SUMMARY OF THE INVENTION

Accordingly, it is an object of the present invention to provide a DRAM cell having an isolation merged trench which is made to increase the area efficiency of a storing capacitor by utilizing both surfaces of a storing electrode within the trench as a capacitor.

Another object of the present invention is to provide an improved DRAM cell having an isolation merged trench which is made to be able to apply ½ (half) Vcc voltage through an $n^+$ electrode by connecting a plate electrode within a trench and an $n^+$ electrode substrate.

A further object of the present invention is to provide a method for manufacturing a DRAM cell having an isolation merged trench comprising the following steps: forming a primary dielectric for a capacitor within an interior of a trench; depositing an $n^+$ doped polysilicon; forming a secondary dielectric and then disposing a polysilicon region thereon; and connecting the polysilicon region with an $n^+$ diffusion layer at the bottom of the trench. As a result, a relationship between the $n^+$ polysilicon storing electrode and the $n^+$ polysilicon plate and all of the capacitors of the polysilicon storing electrode with the $n^+$ diffusion layer plate are utilized as a storing capacitor.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

Briefly described, the present invention relates to a method for manufacturing a DRAM cell having an isolation merged trench for use in 16 megabit and 64 megabit DRAM cells. The method comprises the steps of forming a primary dielectric for a capacitor within the interior of a trench, depositing an n+ doped polysilicon, forming a secondary dielectric and then stacking a polysilicon thereon and connecting the polysilicon region within an n+ diffusion layer at the bottom of the trench for forming a plate. As a result, all of the capacitors disposed between the n+ polysilicon storing electrode and the n+ polysilicon plate as well as the polysilicon storing electrode and the n+ diffusion layer plate are utilized as a storing capacitor.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 5k is a schematic cross-sectional view showing a process for etching back the polysilicon;

FIG. 5l is a schematic cross-sectional view showing a process for growing a field oxide film and forming a word line;

FIG. 5m is a schematic cross-sectional view showing a process for finishing the DRAM cell.

DESCRIPTION OF THE PREFERRED EMBODIMENTS

Figure 1:
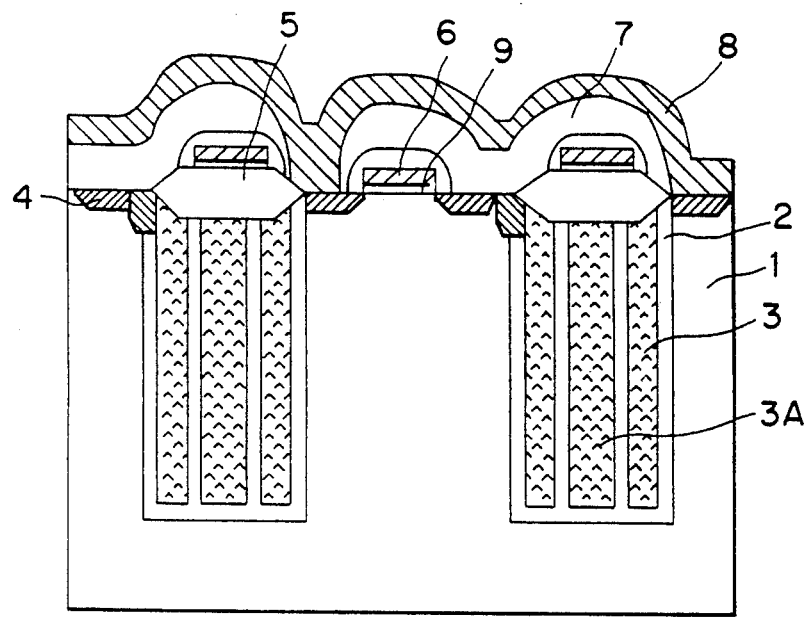
FIG. 1 is a cross-sectional view of a conventional IVEC.
Figure 2:
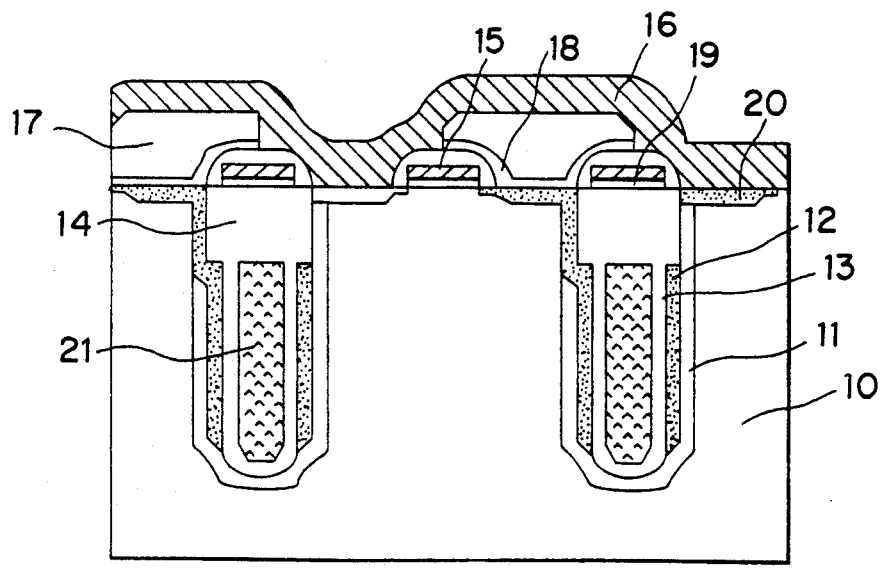
FIG. 2 is a cross-sectional view of a conventional SCC.
Figure 3:
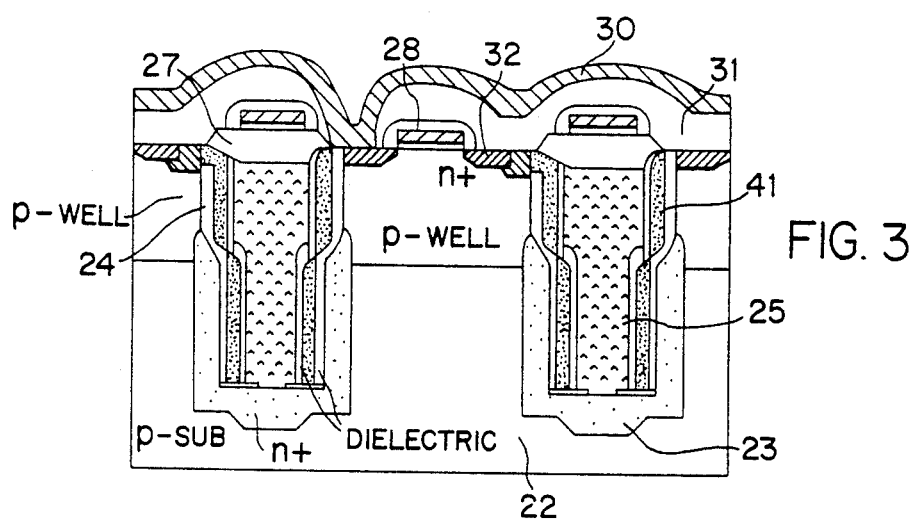
FIG. 3 is a cross-sectional view of a DRAM cell having an isolation merged trench according to an embodiment of the present invention.

Referring now in detail to the drawings for the purpose of illustrating the preferred embodiments of the present invention, the DRAM cell having an isolation merged trench as shown in FIG. 3, includes a silicon substrate 22, n+ diffusion layers 23 and 32, a side wall field oxide film 24, n+ doped polysilicon regions 25, 2 and 41 and silicon oxide films 27, 29 and 31.

Figure 4:
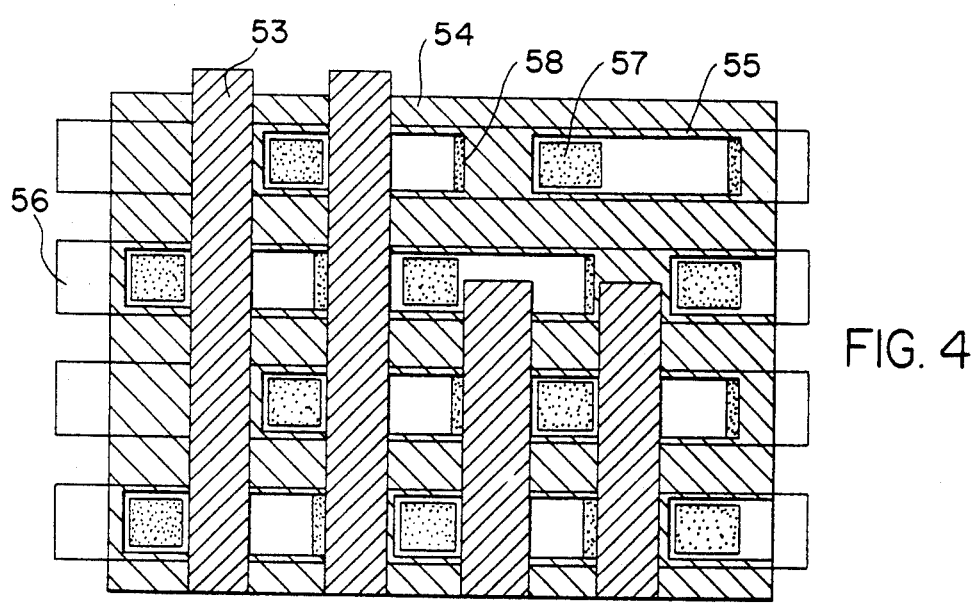
FIG. 4 is a fragmentary schematic diagram showing a layout of the DRAM cell having an isolation merged trench according to an embodiment of the present invention.

FIG. 4 shows a layout of the DRAM cell having an isolation merged trench according to the present embodiment, which includes a word line 53, a trench 54, an active region 55, a bit line 56, a bit line contact 57, a buried contact 58 of the n+ diffusion layers and the n+ polysilicon regions.

FIGS. 5a to 5m show the manufacturing processes according to the present embodiment.

Figure 5A:
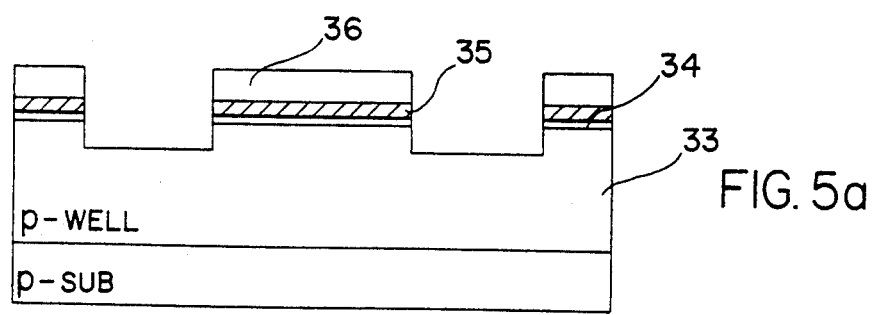
FIG. 5a is a schematic cross-sectional view showing a process for 5a etching a primary trench.

FIG. 5a shows an etching step of the primary trench, wherein a p-well 33 is formed on the top surface of a silicon substrate to a thickness of about 2 μm, and then an oxide film 34 is grown on the top surface of the p-well 33 to a thickness of 250 angstroms, and a silicon nitride film 35 is deposited to a thickness of 1500 angstroms. Thereafter, an oxide film 36 is deposited to a thickness of 8,000 angstroms by the chemical vapor depositing (CVD) method and the CVD oxide film 36 is densificated for 30 minutes under an $H_2O$ environment having a temperature of about 925° C., whereby a masking layer is formed for trench etching. Thereafter, the masking layer is etched by the reactive ion etching method in order of the oxide film 36, the silicon nitride film 35, and the oxide film 34 of the portion to be formed with the trench and then the p-well 33 is etched to a depth of about 1000-2000 angstroms, whereby primary etching is executed.

Figure 5B:
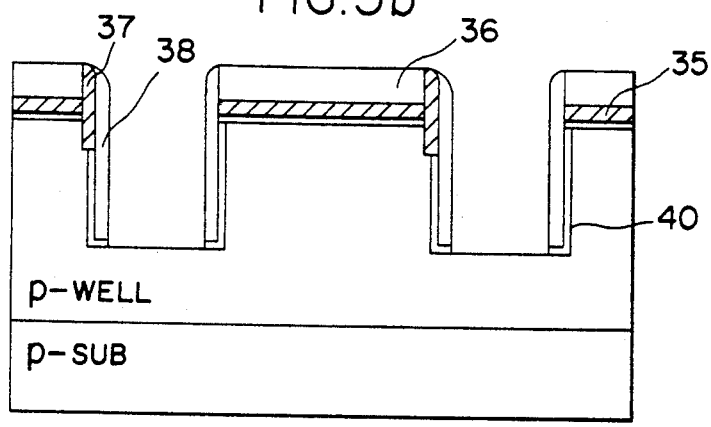
FIG. 5b is a schematic cross-sectional view showing a process for etching a secondary trench.

FIG. 5b shows an etching step of the secondary trench, wherein after the primary trench is formed, the silicon nitride film is deposited on the entire surface to a thickness of 700 angstroms, whereby the silicon nitride film spacer 37 is made. Thereafter, except for the connecting portion between the n+ polysilicon storing electrode and the n+ source of transfer transistor, the remaining portion is etched by the wet type method, whereby the p-well 33 is formed with the secondary trench etching to about 1.5 μm.

The ion implanting is executed to the side wall of the trench by boron in a dose of $10^{13}$ and thereafter, the side wall field oxide film 40 of approximately 2000 angstroms is grown under an $H_2O$ environment of a temperature about 920° C., whereby the leakage current of a parasitic transistor in the vertical and horizontal directions is prevented. Next, the silicon oxide film is deposited to a thickness of 2000 angstroms by the chemical vapor depositing (CVD) method and then etched to the thickness by the reactive ion etching (RIE) method, whereby an oxide film spacer 38 is formed on the wall surface of the trench. The oxide film spacer 38 serves a masking function during the n+ doping.

Figure 5C:
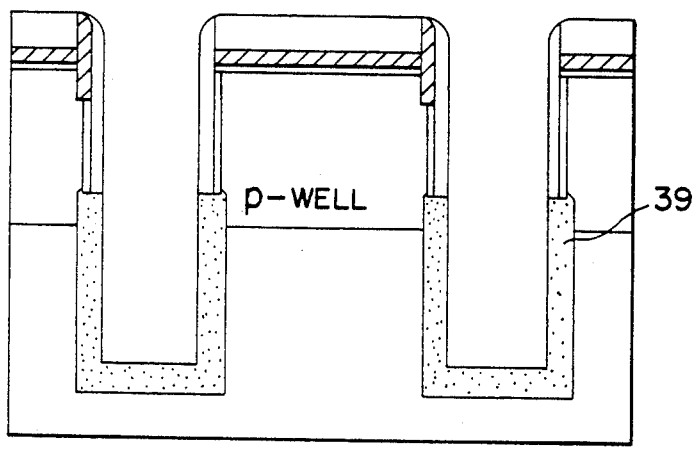
FIG. 5c is a schematic cross-sectional view showing a process for etching a tertiary trench and an n+ doping for thereby forming a substrate electrode.

FIG. 5c shows a forming step of the substrate electrode by executing the n+ doping after tertiary trench etching, wherein the p-well 33 and the silicon substrate are etched to a thickness of 3-4 μm by utilizing the oxide film spacer 38. Then the silicon substrate exposed by using a PSG (Phospho silicate glass) or an n-type diffusion source is doped to the n+ and thereafter, an n+ diffusion layer 39 for connecting the polysilicon plate and an n+ diffusion layer plate is formed.

Figure 5D:
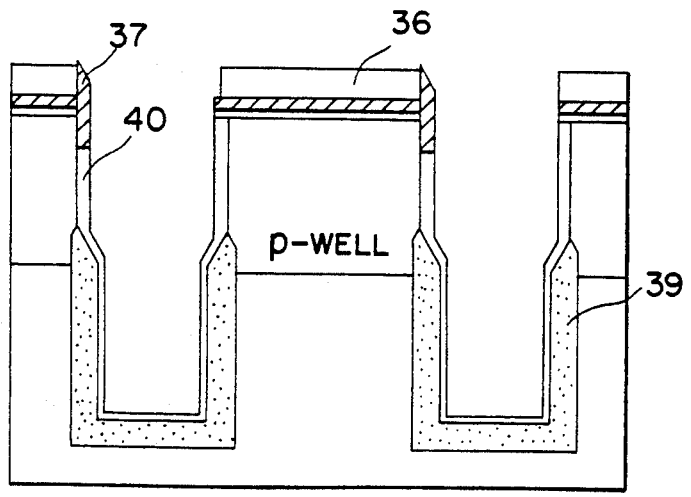
FIG. 5d is a schematic cross-sectional view showing a process for forming a primary capacitor dielectric.

FIG. 5d shows a forming step of the capacitor oxide film, wherein the oxide film is etched as much as the thickness of the oxide film spacer 38. Thereafter, the oxide film is formed to a thickness of 50-100 angstroms by a primary capacitor dielectric 43a.

At this moment, a side wall field oxide film 40 having a thickness of about 2000 angstroms remains at the top portion of the n+ diffusion layer 39, whereby the primary capacitor dielectric 43a is formed. This serves a function of raising the threshold voltage of the vertical parasitic MOSFET together with the density of boron of the ion implanted trench side wall.

Figure 5E:
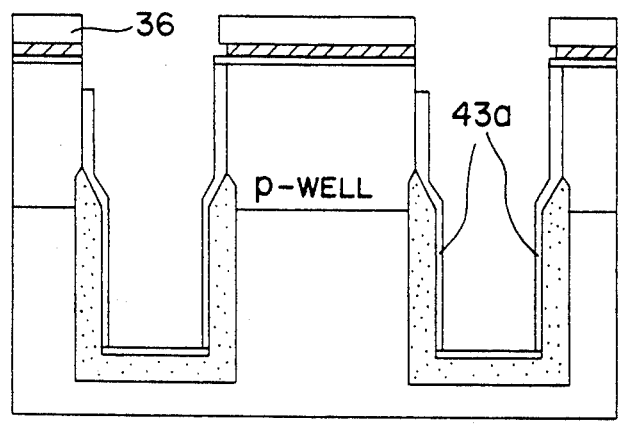
FIG. 5e is a schematic cross-sectional view showing a process for eliminating a silicon nitride spacer.

FIG. 5e show an eliminating step of the silicon nitride film spacer, wherein the silicon nitride film spacer 37 for connecting the storing electrode and the n+ source is eliminated, whereby the n+ polysilicon for the charge storing electrode is deposited so that the diffusion is easily made to the exposed silicon substrate.

Figure 5F:
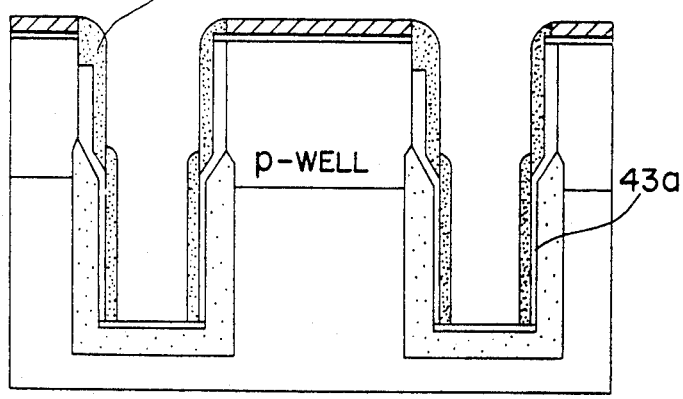
FIG. 5f is a schematic cross-sectional view showing a process for forming a charge storage node.

FIG. 5f shows a forming step of the charge storing electrode, wherein the polysilicon is deposited to a thickness of 1,000 angstroms and doped with $POCl_3$, and then etched to the thickness by the reactive ion etching method, whereby a storing electrode 41 of the polysilicon, which is doped n+ only, at the wall surface of the trench is formed.

Figure 5G:
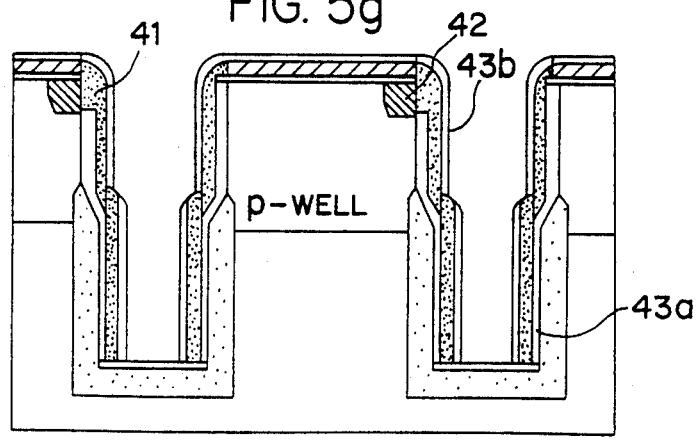
FIG. 5g is a schematic cross-sectional view showing a process for forming a secondary capacitor dielectric.

FIG. 5g shows a forming step of the secondary capacitor dielectric, wherein a secondary capacitor dielectric 43 is ONO (Oxide/nitride/oxide) structure and the thickness of the equivalent oxide film is formed to about 50-100 angstroms. During a suffering thermal treating process, an n+ layer 42 is diffused through the window to the P-well 33 which consequently connects with the n+ source of the transistor.

Figure 5H:
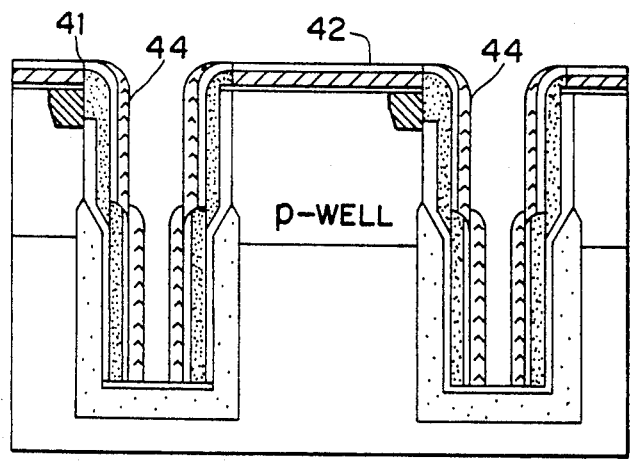
FIG. 5h is a schematic cross-sectional view showing a process for forming a polysilicon spacer.

FIG. 5h shows a forming step of the polysilicon spacer, wherein the polysilicon is deposited to a thickness of 1000 angstroms and then doped with $POCl_3$ and thereafter, etched by the reactive ion etching method, whereby the polysilicon spacer 44 is formed only to the wall surface of the trench.

Figure 5I:
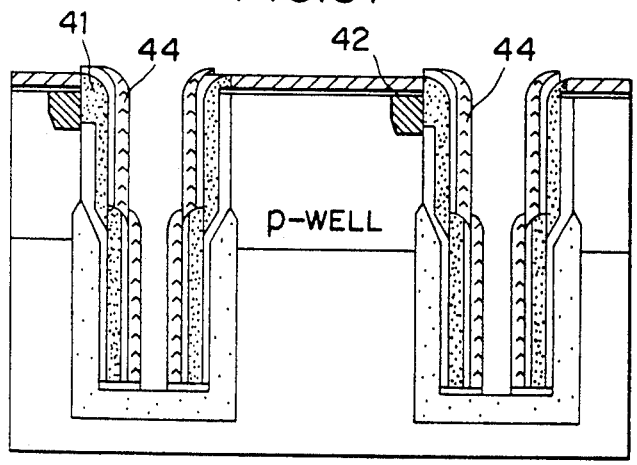
FIG. 5i is a schematic cross-sectional view showing a process for eliminating a capacitor oxide film at the bottom portion of the trench.

FIG. 5i shows an eliminating step of the capacitor oxide film at the bottom portion of the trench, wherein the capacitor dielectric 43a located at the bottom of the trench is eliminated by the reactive ion etching method. As a result, the n+ diffusion layer plate and the n+ polysilicon plate may be easily connected to each other.

Figure 5J:
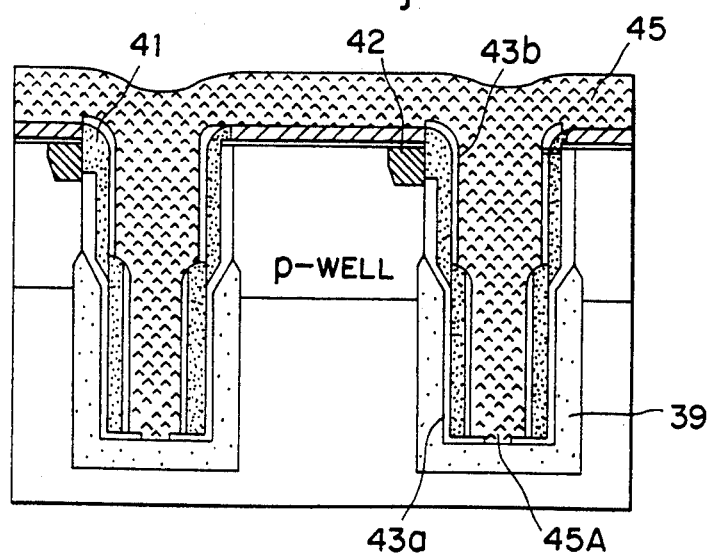
FIG. 5j is a schematic cross-sectional view showing a process for depositing a polysilicon for the plate.

FIG. 5j shows a depositing step of the polysilicon, wherein the polysilicon having a sufficient thickness is deposited to the overall surface, whereby a polysilicon layer 45 is broadly formed.

FIG. 5k shows an etching back step of the polysilicon, wherein the polysilicon layer 45 filled again is etched back. As a result, the polysilicon layer 45 remains only in the interior of the trench, whereby the polysilicon layer 45 is formed.

FIG. 5l shows a defining step of the active region and a simultaneous word line forming step, wherein a field oxide film 46 is formed by using the active mask and then a gate oxide film 47 is grown. Thereafter, the word line is formed with the polysilicon or the polycide and then a field oxide film 49 is grown.

FIG. 5m shows a finishing step of the DRAM cell, wherein a source and a drain 52 are formed and then a silicon oxide film 51 is disposed thereon. Thereafter, a bit line 50 of an aluminum metal wiring is formed and the cell is finished.

Figure 6A:
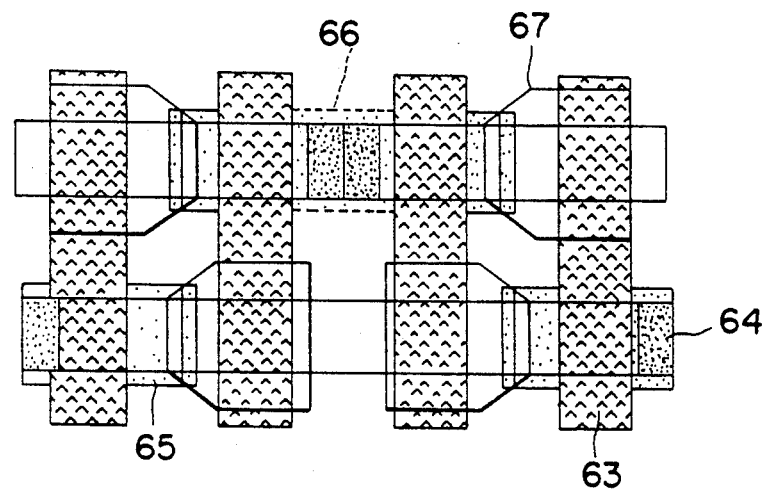
FIGS. 6a and 6b are schematic cross-sectional views showing another embodiment of the present invention.
Figure 6B:
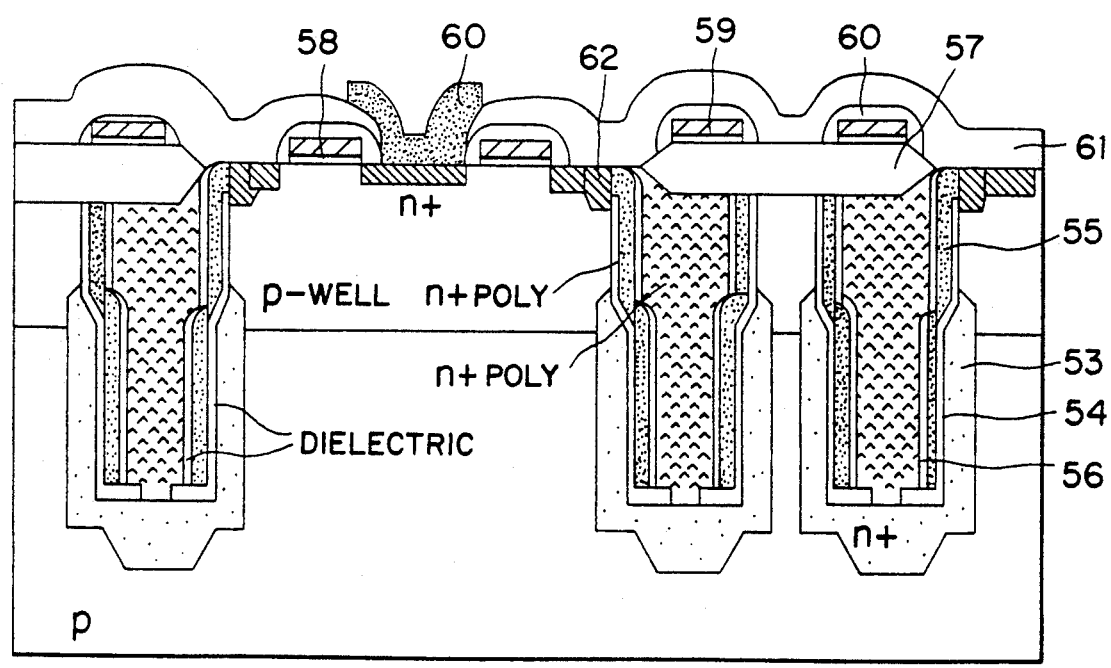

FIGS. 6a and 6b show a structure manufactured by another embodiment of the present invention.

FIG. 6a shows the layout of the cell, wherein reference numeral 63 represents a word line, numeral 67 is a trench, numeral 66 is an active region, numeral 65 is a bit line, and numeral 64 represents a buried contact, respectively.

FIG. 6b shows a structure of cell, wherein reference numeral 53 represents an n+ diffusion layer, numerals 54 and 56 are capacitor dielectrics and numerals 55 and 59 are n+ diffusion layers, respectively. The cell structure is not of a form where the trench surrounds the active region. As a structure of the cell having a merged trench as a SPT (Substrate plate trench), it is a state of applying a cell of the trench type as a form for storing a charge into the interior of the trench.

Accordingly, although the area efficiency is reduced by the structure of isolation merged trench, the storing capacitor is formed larger than the cell of the conventional trench structure.

Therefore, according to the present embodiment, after the primary dielectric is formed, the n+ polysilicon is deposited and the secondary dielectric is formed and then the n+ polysilicon is deposited thereon. While the secondary dielectric is formed and then the n+ polysilicon is disposed thereon the n+ diffusion layer of the bottom of the trench is connected, the plate is subsequently formed so that all of the capacitors between the n+ polysilicon storing electrode and the n+ polysilicon plate as well as between the n+ silicon storing electrode and the n+ diffusion layer plate are used as a storing capacitor. Therefore, the area of the storing capacitor is expanded about 1.8 times compared with area of the conventional storing capacitor. Also, the structure of the device is not only advantageous to noise but also advantageous for applying to the highly integrated cell.

The invention being thus described, it will be obvious that the same may be varied in many ways. Such variations are not to be regarded as a departure from the spirit and scope of the invention, and all such modifications as would be obvious to one skilled in the art are intended to be included in the scope of the following claims.

What is claimed is:

1. A method for forming a DRAM cell having an isolation merged trench, comprising the steps of:
   (a) preparing a silicon substrate on which a p-well is formed;
   (b) sequentially forming a first oxide film, a first silicon nitride film and a second oxide film on said p-well;
   (c) etching back said first oxide film, said first silicon nitride film, said oxide film and said p-well at a portion to form a first trench therein by using a trench mask to form said first trench;
   (d) forming a second silicon nitride film as a first spacer on an interior side wall surface of said first trench;
   (e) etching back said p-well in a depth direction of said first trench to form a second trench;
   (f) implanting impurity ions to said p-well through an interior side wall of said second trench and forming a side wall field oxide film on said interior side wall to prevent leakage current from occurring;
   (g) forming a third oxide film as a second spacer on said interior side wall of said second trench;
   (h) etching back the remainder of said p-well and a predetermined depth of said silicon substrate in a depth direction in said second trench to form a third trench;
   (i) doping ions of an n-type impurity to the exposed p-well and said silicon substrate to form an n+ diffusion layer therein;
   (j) removing said second spacer and forming a fourth oxide film as a first capacitor dielectric on the surface of said n+ diffusion layer;
   (k) removing said first spacer and said second oxide film, forming an n+ polysilicon of a storing electrode on the inside surfaces of said first, second and third trenches and annealing to form an n+ layer in a portion of said p-well having said n+ polysilicon contacted thereof;

(l) forming a fifth oxide film as a second capacitor dielectric on the surface of said n+ polysilicon;

(m) forming a first polysilicon layer as a third spacer on the surface of said second capacitor dielectric;

(n) removing said first capacitor dielectric at the bottom of said third trench and filling a second polysilicon layer as a plate electrode within the interior of said third trench to connect said n+ diffusion layer and said plate electrode with each other;

(o) sequentially forming a field oxide film, a gate oxide film and a word line; and (p) forming a silicon oxide film on said word line and etching back said silicon oxide film at a portion of said n+ layer for electrically connecting a bit line formed on said silicon oxide.

* * * * *